(12) United States Patent
Oh et al.

(10) Patent No.: US 8,368,078 B2
(45) Date of Patent: Feb. 5, 2013

(54) THIN FILM TRANSISTOR ARRAY SUBSTRATE AND MANUFACTURING METHOD THEREOF

(75) Inventors: Chung Wan Oh, Osan-si (KR); Jae Chang Kwon, Gyeongbuk (KR); Yu Ri Shim, Gumi-si (KR); Chang Yeop Shin, Gumi-si (KR); Dong Eok Kim, Mokpo-si (KR)

(73) Assignee: LG Display Co., Ltd., Seoul (KR)

( * ) Notice: Subject to any disclaimer, the term of this patent is extended or adjusted under 35 U.S.C. 154(b) by 407 days.

(21) Appl. No.: 12/591,839

(22) Filed: Dec. 2, 2009

(65) Prior Publication Data
US 2010/0207122 A1 Aug. 19, 2010

(30) Foreign Application Priority Data

Feb. 18, 2009 (KR) .................. 10-2009-0013612

(51) Int. Cl.
*H01L 27/15* (2006.01)
*H01L 29/26* (2006.01)
*H01L 31/12* (2006.01)
*H01L 33/00* (2010.01)

(52) U.S. Cl. ........... 257/72; 257/E21.414; 257/E21.111; 257/290; 438/151; 438/157; 438/158; 438/30; 438/150; 349/122; 349/43; 349/46

(58) Field of Classification Search ............ 257/72, 257/290, E21.414, E27.111; 349/122, 43, 349/46; 438/151, 157, 158, 30, 150
See application file for complete search history.

(56) References Cited

U.S. PATENT DOCUMENTS

| 7,166,864 B2 * | 1/2007 | Ahn et al. ........................ 257/72 |
| 7,300,830 B2 * | 11/2007 | Yoo et al. ...................... 438/151 |
| 7,501,298 B2 * | 3/2009 | Ahn et al. ........................ 438/30 |

(Continued)

FOREIGN PATENT DOCUMENTS

| KR | 10-2005-0058057 | 6/2005 |
| KR | 10-2005-0115746 | 12/2005 |

(Continued)

*Primary Examiner* — Telly Green
(74) *Attorney, Agent, or Firm* — McKenna Long & Aldridge, LLP (57) ABSTRACT

A thin film transistor array substrate is disclosed. The thin film transistor array substrate includes: gate lines and data lines formed to cross each other in the center of a gate insulation film on a substrate and to define pixel regions; a thin film transistor formed at each intersection of the gate and data lines; a passivation film formed on the thin film transistors; a pixel electrode formed on each of the pixel regions and connected to the thin film transistor through the passivation film; a gate pad connected to each of the gate lines through a gate linker; and a data pad connected to each of the data lines through a data linker. The data pad is formed of a gate pattern, and the data line is formed of a data pattern. The data linker is configured to connect the data pad formed of the gate pattern with the data line formed of the data pattern using a connection wiring. Also, the data linker includes the gate pattern connected to the data pad, the data pattern formed opposite to the gate pattern in the center of the gate insulation film, and the connection wiring configured to connect the gate pattern with the data pattern through a first contact hole which exposes the data pattern and the gate pattern by penetrating through the passivation film and the gate insulation film.

5 Claims, 10 Drawing Sheets

U.S. PATENT DOCUMENTS

| | | | |
|---|---|---|---|
| 7,977,171 B2* | 7/2011 | Yang et al. | 438/151 |
| 2005/0077524 A1* | 4/2005 | Ahn et al. | 257/72 |
| 2005/0078246 A1* | 4/2005 | Yoo et al. | 349/122 |
| 2005/0130353 A1* | 6/2005 | Yoo et al. | 438/151 |
| 2007/0218577 A1* | 9/2007 | Ahn et al. | 438/30 |
| 2008/0003723 A1* | 1/2008 | Yang et al. | 438/129 |
| 2009/0309101 A1* | 12/2009 | Kim et al. | 257/59 |

FOREIGN PATENT DOCUMENTS

KR    10-2007-0068776    7/2007

* cited by examiner

FIG. 6D

THIN FILM TRANSISTOR ARRAY SUBSTRATE AND MANUFACTURING METHOD THEREOF

CROSS-REFERENCE TO RELATED APPLICATION

This application claims priority under 35 U.S.C. 119 to Korean Patent Application No. 10-2009-0013612, filed on Feb. 18, 2009, which is hereby incorporated by reference in its entirety.

BACKGROUND

1. Field of the Disclosure

This disclosure relates to a liquid crystal display device and a manufacturing method thereof, and more particularly to a thin film transistor array substrate and a method for manufacturing the same.

2. Description of the Related Art

Liquid crystal display devices generally control the light transmissivity of liquid crystal having dielectric anisotropy liquid crystal using an electric field, so as to display pictures. The liquid crystal display device is manufactured to include a color filter substrate with a color filter array and a thin film transistor array substrate which are disposed opposite to each other in the center of liquid crystal layer.

The thin film transistor array substrate is configured to include a plurality of pixel electrodes formed in a matrix shape. The plurality of pixel electrodes individually receive data signals. The thin film transistor array substrate further includes a plurality of thin film transistors configured to individually driver the plurality of pixel electrodes, a plurality of gate lines used for controlling the thin film transistors, and a plurality of data lines guiding data signals to the thin film transistors.

As such, the thin film transistor array substrate has a stacked layer structure that a plurality of insulation layers and a plurality of conductive layers are stacked on. The thin film transistor array substrate is configured to include first to third conductive layers opposite to one another in the center of the insulation layers. The first conductive layer forms the gate lines and gate electrodes of the thin film transistors. The second conductive layer forms the data lines and source/drain electrodes of the thin film transistors. The third conductive layer forms the plurality of pixel electrodes and others.

Moreover, the thin film transistor array substrate includes a plurality of jumpers which correspond to the third conductive layer and are used for connecting the first and second conductive layers. Each of the jumpers passes through a first contact hole and a second contact hole and contacts the first and second conductive layers. The first contact hole penetrates two insulation films and exposes the first conductive layer. The second contact hole penetrates one insulation film and exposes the second conductive layer.

However, the third conductive layer used for forming the pixel electrodes and others is formed from a transparent electrode material, such as indium tin oxide, which has a large sheet resistance. Accordingly, the contact resistance characteristic becomes lower, and the contact resistance characteristic of the jumper is deteriorated.

BRIEF SUMMARY

Accordingly, the present embodiments are directed to a thin film transistor array substrate that substantially obviates one or more of problems due to the limitations and disadvantages of the related art, and a manufacturing method thereof.

An object of the present embodiment is to provide a thin film transistor array substrate adapted to enhance the contact resistance characteristic of jumpers, and a method of manufacturing the same.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a thin film transistor array substrate includes: gate lines and data lines formed to cross each other in the center of a gate insulation film on a substrate and to define pixel regions; a thin film transistor formed at each intersection of the gate and data lines; a passivation film formed on the thin film transistors; a pixel electrode formed on each of the pixel regions and connected to the thin film transistor through the passivation film; a gate pad connected to each of the gate lines through a gate linker; and a data pad connected to each of the data lines through a data linker. The data pad is formed of a gate pattern, and the data line is formed of a data pattern. The data linker is configured to connect the data pad formed of the gate pattern with the data line formed of the data pattern using a connection wiring. Also, the data linker includes the gate pattern connected to the data pad, the data pattern formed opposite to the gate pattern in the center of the gate insulation film, and the connection wiring configured to connect the gate pattern with the data pattern through a first contact hole which exposes the data pattern and the gate pattern by penetrating through the passivation film and the gate insulation film.

The first contact hole can be formed to expose the data pattern between its side walls and have a bottom surface corresponding to the exposed gate pattern. Alternatively, the first contact hole can be formed to expose the data pattern between parts of its side walls and have a bottom surface corresponding to the exposed gate pattern.

The thin film transistor array substrate further includes a second contact hole formed to penetrate through the passivation film and the gate insulation film and expose the gate pattern. In this case, the connection wiring individually passes through the first and second contact holes.

A method of manufacturing a thin film transistor array substrate according to another aspect of the present embodiment includes: forming gate lines, gate electrodes, and gate patterns on a substrate; forming a gate insulation film on the substrate partially covered with the gate lines, the gate electrodes, and the gate patterns; forming source/drain electrodes, data lines, and data patterns on the substrate covered with the gate insulation film; forming a passivation film on the substrate partially covered with the source/drain electrodes, the data lines, and the data patterns; patterning the passivation film to form first contact holes exposing the drain electrodes; patterning the passivation film and the gate insulation film to form, a second contact holes exposing the data patterns and the gate patterns; and forming pixel electrodes which each pass through the first contact holes and connection wirings that each pass through the second contact holes.

The formation of the first and second contact holes includes a step of patterning the passivation film and the gate insulation film to form third contact holes which expose the gate patterns. The connection wiring passes through the first and second contact holes.

The first contact hole can be formed to expose the data pattern between its side walls and have a bottom surface corresponding to the exposed gate pattern. Alternatively, the first contact hole can be formed to expose the data pattern between parts of its side walls and have a bottom surface corresponding to the exposed gate pattern.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Thin film transistor array substrates with the features described above and manufacturing methods thereof according to embodiments of the present disclosure will now be explained referring to the attached drawings.

Figure 1A:
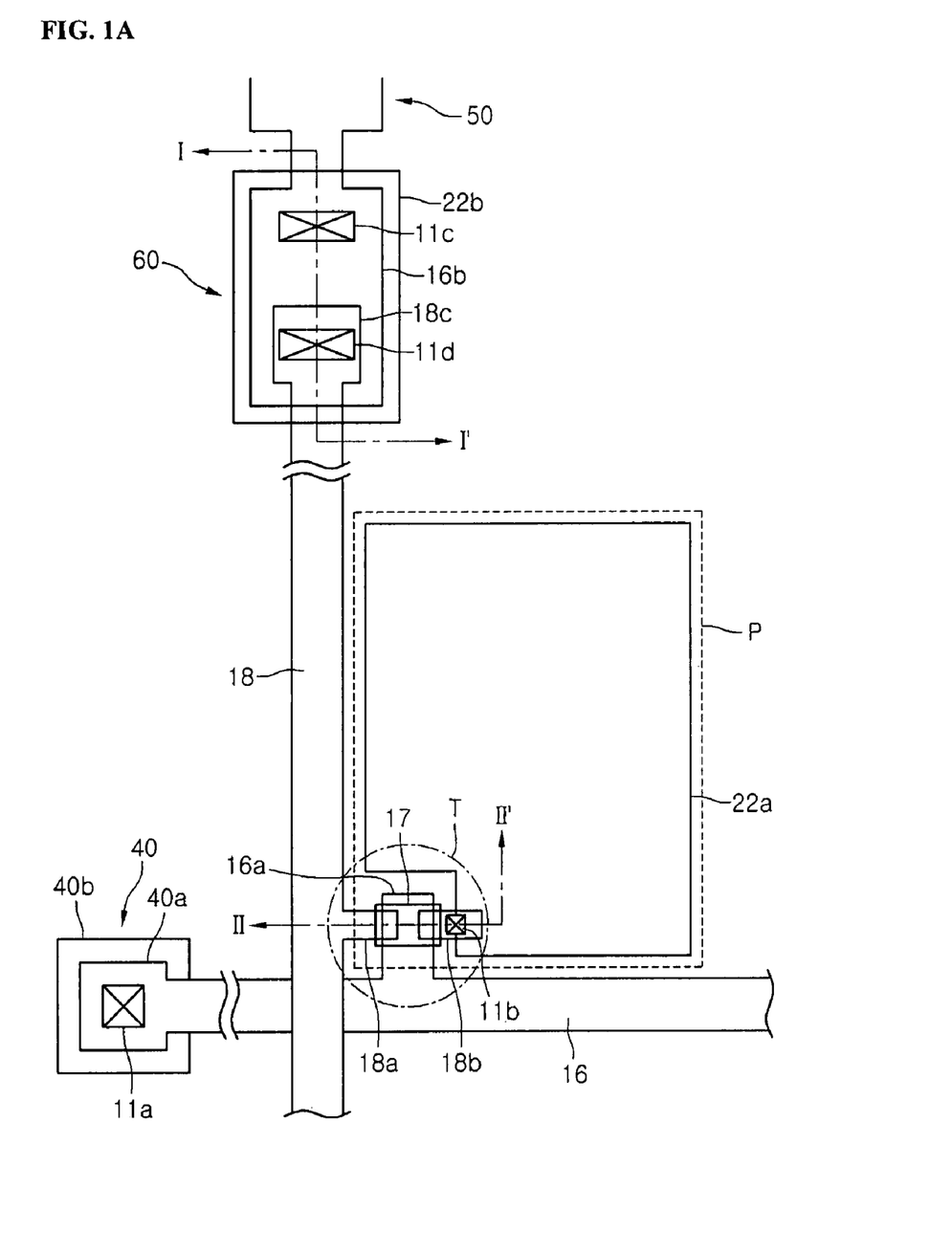
FIG. 1A is a planar view showing a thin film transistor array substrate according to a first embodiment the present disclosure.
Figure 1B:
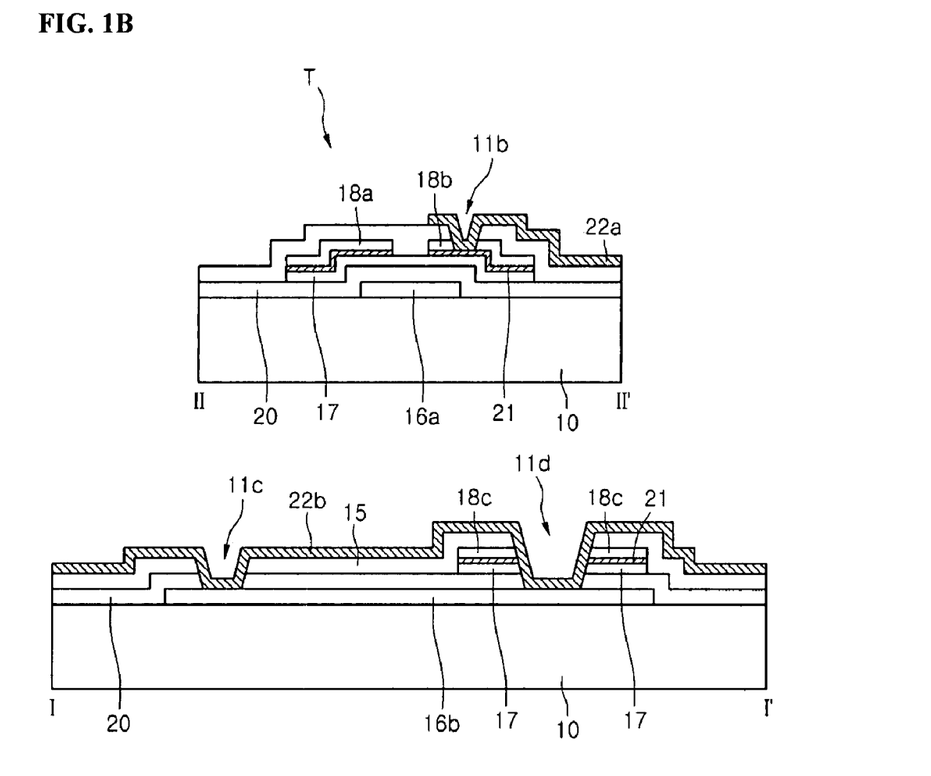
FIG. 1B is a cross-sectional view showing a thin film transistor array substrate taken along the lines I-I' and II-II' of FIG. 1A.

FIG. 1A is a planar view showing a thin film transistor array substrate according to a first embodiment the present disclosure, and FIG. 1B is a cross-sectional view showing a thin film transistor array substrate taken along the lines I-I' and II-II' of FIG. 1A. FIGS. 2A to 2D are cross-sectional views showing a process of manufacturing a thin film transistor array substrate according to a first embodiment of the present disclosure.

As shown in FIGS. 1A and 1B, a thin film transistor array substrate according to a first embodiment of the present disclosure includes a gate line 16, a data line 18, a thin film transistor T, a pixel electrode 22a, a gate pad 40, and a data pad 50. The gate line 16 and the data line 18 are formed separately from each other in the center of a gate insulation film 20 on a lower substrate 10. These gate and data lines 16 and 18 cross each other and define a pixel region P. The thin film transistor T is formed at an intersection of the gate and data lines 16 and 18. The pixel electrode 22a is formed on the pixel region P provided by crossing the gate and data lines 16 and 18. The gate pad 40 is connected to the gate line 16, and the data pad 50 is connected to the data line 18.

The thin film transistor T responds to a gate signal on the gate line 16 and enables a pixel signal to be charged and maintained into the pixel electrode 22a. To this end, the thin film transistor T is configured to include a gate electrode 16a connected to the gate line 16, a source electrode 18a connected to the data line 18, and a drain electrode 18b connected to the pixel electrode 22a. The thin film transistor T further includes an active layer 17 which is disposed to overlap with the gate electrode 16a in the center of the gate insulation film 20 and to form a channel between the source and drain electrodes 18a and 18b. Moreover, the thin film transistor T includes an ohmic contact layer 21 formed in ohmic contact with the source electrode 18a and the drain electrode 18b on the active layer 17.

The pixel electrode 22a formed on the pixel region P is connected to the drain electrode 18b of the thin film transistor T via a first contact hole 11a penetrating through a passivation film (or a protective film) 15. As such, an electric field can be generated between the pixel electrode 22a, which receives the pixel signal through the thin film transistor T, and a common electrode (not shown) receiving a reference voltage.

The gate pad 40 is connected to a gate driver (not shown) via a gate linker (not shown) in order to transfer the gate signal applied from the gate driver to the gate line 16 via a gate linker (not shown). To this end, the gate pad 40 is configured to include a lower gate pad electrode 40a and an upper gate pad electrode 40b. The lower gate pad electrode 40a extends from the gate linker (not shown) and the gate line 16. The upper gate pad electrode 40b is connected to the lower gate pad electrode 40a via a second contact hole 11b penetrating through the passivation film 15 and the gate insulation film 20.

The data pad 50 is connected to a data driver (not shown) in order to transfer the data signal applied from the data driver to the data line 18 via a data linker 60. Such a data pad 50 is formed of a gate pattern which is used for the formation of the gate electrode 16a, the gate line 16, and others. The data line 18 is formed of a data pattern which is used in the formation of the source/drain electrodes 18a and 18b. Also, the data linker 60 connects the data pad 50 of the gate pattern with the data line 18 of the data pattern using a jumper portion (i.e., a connection wiring 22b).

The data linker 60 is configured to include a gate pattern 16b used for forming the data pad 50, a data pattern 18c formed to overlap with a part of the gate pattern 16b in the center of the gate insulation film 20, and a connection wiring (i.e., a jumper portion) 22b connected to the gate pattern 16b and the data pattern 18c each through third and fourth contact holes 11c and 11d. The third contact hole 11c penetrates through the passivation film 15 and the gate insulation film 20 and exposes the gate pattern 16b. The fourth contact hole 11d penetrates through the passivation film 15, the data pattern 18c, the ohmic contact layer 21, the active layer 17, and the gate insulation film 20, so as to expose the data pattern 18c and the gate pattern 16b. More specifically, the data pattern 18c is exposed between the side walls (i.e., lower and upper side walls) of the fourth contact hole 11d, the gate pattern 16b. The surface of the gate pattern 16b under the data pattern 18c is used as the bottom surface of the fourth contact hole 11d.

In this manner, the connection wiring (i.e., the jumper portion) 22b passes through the fourth contact hole 11d which exposes the data pattern 18c and the gate pattern 16a thereunder. As such, the connection wiring 22b has an area larger than that of the related art connection wiring via a contact hole which penetrates through only a single insulation film and exposes only the data pattern. Therefore, the resistance of the connection wiring (the jumper portion) is reduced, and furthermore the contact resistance characteristic of the data linker 60 is enhanced.

A method of manufacturing the thin film transistor array substrate of the LCD device with such a configuration will now be explained as follows.

FIGS. 2A to 2D are cross-sectional views showing a process of manufacturing a thin film transistor array substrate according to a first embodiment of the present disclosure.

Figure 2A:
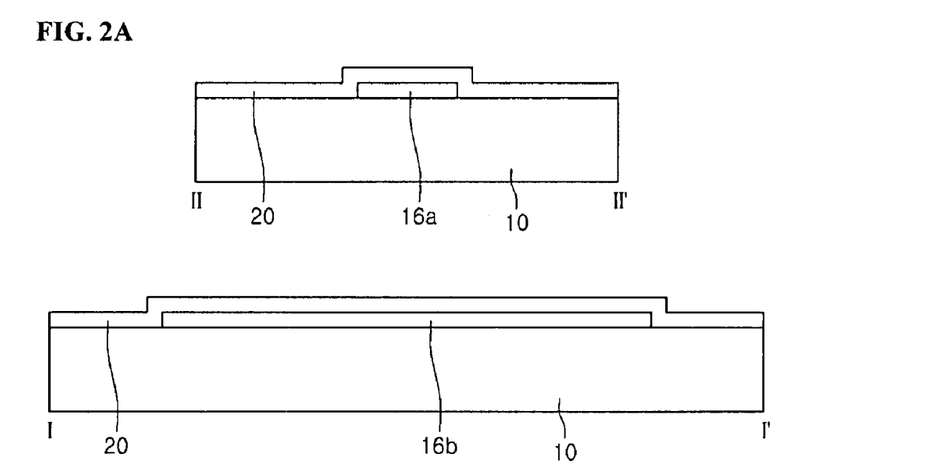
FIGS. 2A to 2D are cross-sectional views showing a process of manufacturing a thin film transistor array substrate according to a first embodiment of the present disclosure.

As shown in FIG. 2A, a gate line (16 in FIG. 1A), a gate electrode 16a, a gate pattern 16b, and a lower gate pad electrode (40a in FIG. 1A) are formed on a lower substrate 10. The gate pattern 16b is positioned at a region in which a data pad (50 in FIG. 1A) and a data linker (60 in FIG. 1A) are defined. The gate line (16 in FIG. 1A), the gate electrode 16a, the gate pattern 16b, and the lower gate pad electrode (40a in FIG. 1A) are prepared through a process of sequentially forming a first metal film and a first photo resist film on the lower substrate 10, then photo-transcribing a first mask onto the first photo resist film using a first mask so as to form a first photo resist pattern (not shown), and etching the first metal film using the first photo resist pattern as an etch mask.

Also, a gate insulation film 20 is formed on the lower substrate 10 which is provided with the gate line, the gate electrode 16a, the gate pattern 16b, and the lower gate pad electrode.

Figure 2B:
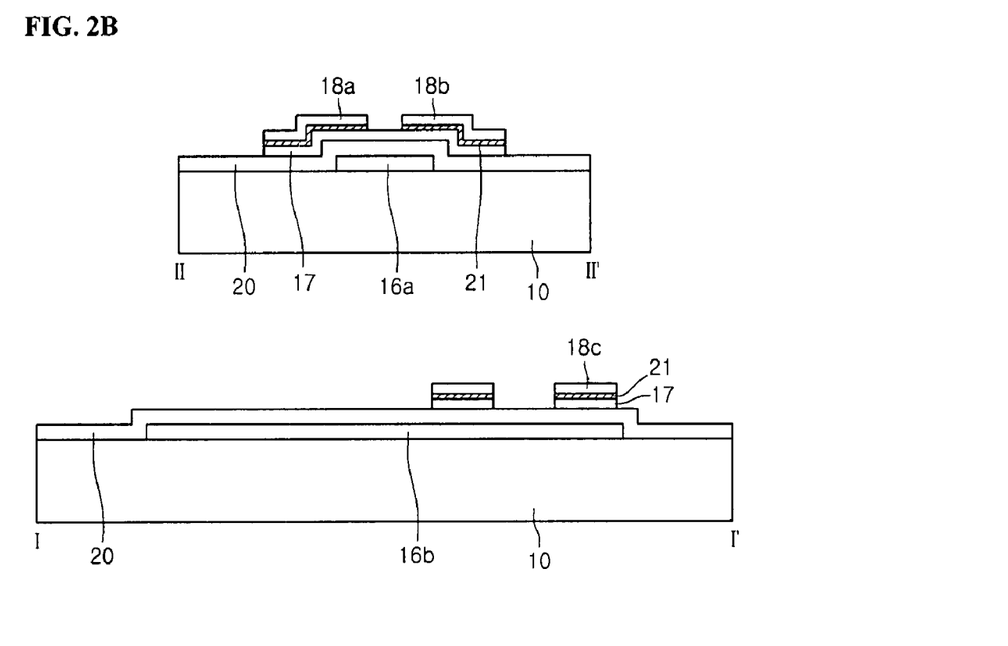

An active layer 17, an ohmic contact layer 21, source/drain electrodes 18a and 18b, a data line (18 in FIG. 1A), and a data pattern 18c are formed on the lower substrate 10 covered with the gate insulation film 20, as shown in FIG. 2B. The data pattern 18c is formed on a part of the gate pattern 16b. The active layer 17, the ohmic contact layer 21, the source/drain electrodes 18a and 18b, the data line (18 in FIG. 1A), and the data pattern 18c are prepared by sequentially forming an intrinsic amorphous silicon film, an n+ amorphous silicon layer, a second metal film, and a second photo resist film (not shown) on the entire surface of the lower substrate 10 covered with the gate insulation film 20, then photo-transcribing a second mask onto the photo resist film so as to form a second photo resist pattern (not shown), and sequentially etching the second metal film, the n+ amorphous silicon film, and the intrinsic amorphous silicon film using the second photo resist pattern as an etch mask.

The source/drain electrodes 18a and 18b, the data line, and the data pattern 18c are formed by patterning the second metal film. The active layer 17 is provided by patterning the intrinsic amorphous silicon film under the source/drain electrodes 18a and 18b. The ohmic contact layer 21 is prepared by patterning the n+ amorphous silicon film in the same shape as the source/drain electrodes 18a and 18b. Moreover, a stacked layer of an intrinsic amorphous silicon pattern and an n+ amorphous silicon pattern, which have the same shape as the data line (18 in FIG. 1A) and the data pattern 18c, is formed under the data line and the data pattern 18c.

The active layer 17, the ohmic contact layer 21, the source/drain electrodes 18a and 18b, the data line (18 in FIG. 1A), and the data pattern 18c can be simultaneously formed through one masking process using a diffraction mask. Alternatively, the active layer 17, the ohmic contact layer 21, the source/drain electrodes 18a and 18b, the data line (18 in FIG. 1A), and the data pattern 18c can be sequentially formed through two masking processes using two masks. In this case, the masking process for forming the active layer 17 and the ohmic contact layer 21 is performed before the other masking process for forming the source/drain electrodes 18a and 18b, the data line (18 in FIG. 1A), and the data pattern 18c.

Figure 2C:
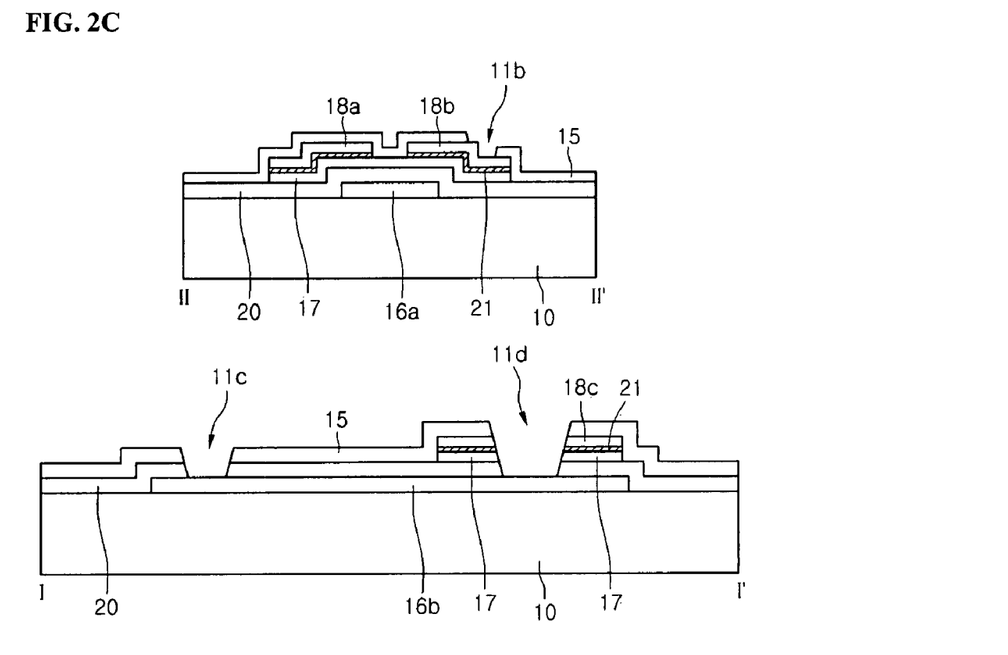

Thereafter, a passivation film 15 is formed on the lower substrate 10 partially covered with the source/drain electrodes 18a and 18b, the data line (18 in FIG. 1A), and the data pattern 18c, as shown in FIG. 2C. Also, a first contact hole (11a in FIG. 1A) and second to fourth contact holes 11b~11d are formed on the passivation film 15.

The first contact hole 11a penetrates through the passivation film 15 and the gate insulation film 20 and partially exposes the lower gate pad electrode (40a in FIG. 1A). The second contact hole 11b penetrates through only the passivation film 15 and exposes a part of the drain electrode 18b. The third contact hole 11c penetrates through the passivation film 15 and the gate insulation film 20 so as to expose a part of the gate pattern 16b. The fourth contact hole 11d penetrates the passivation film 15, the data pattern 18c, the ohmic contact layer 21, the active layer 17, and the gate insulation film 20 and exposes another part of the gate pattern 16b. The fourth contact hole 11d further exposes the data pattern 18c between its side walls (i.e., an upper side wall of the passivation film 15 and a lower side wall consisting of the ohmic contact layer 21, the active layer 17, and the gate insulation film 20). Such a fourth contact hole 11d uses the exposed portion of the gate pattern 16b as its bottom surface.

In order to form the first to fourth contact holes 11a~11d, a third photo resist film is provided on the passivation film 15. A third photo resist pattern is prepared on the passivation film 15 by photo-transcribing a third mask onto the third photo resist film. Subsequently, only the passivation film 15, together with the gate insulation film 20, or a stack structure of the passivation film 15, the data pattern 18c, the ohmic contact layer 21, the active layer 17, and the gate insulation film 20 are partially etched using the third photo resist pattern as an etch mask, thereby forming the first to fourth contact holes 11a~11d.

Figure 2D:
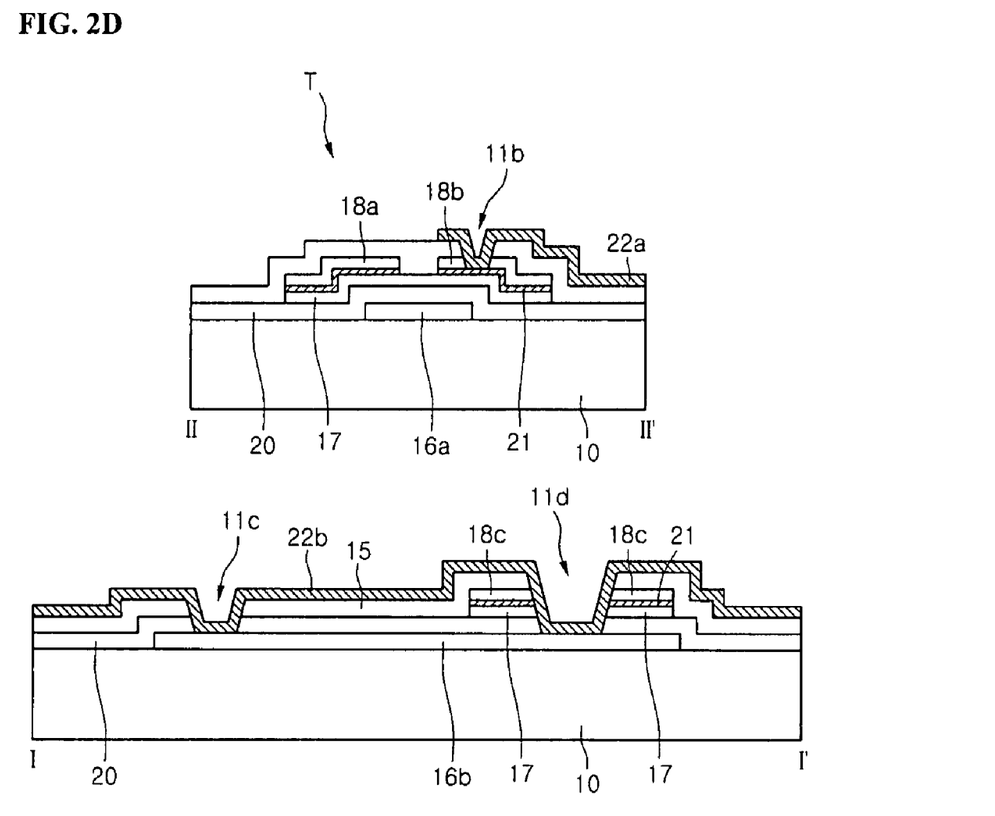

The manufacturing process of a thin film transistor array substrate is completed by forming a pixel electrode 22a, a connection wiring (i.e., a jumper portion) 22b, and an upper gate pad electrode 40b on the lower substrate 10 with the first to fourth contact holes 11a~11d as shown in FIG. 2D. The pixel electrode 22a is connected to the drain electrode 18b through the second contact hole 11b. The upper gate pad electrode 40b is connected to the lower gate pad electrode 40a through the first contact hole 11a. The connection wiring 22b is connected to the gate pattern 16b and the data pattern 18c through the third and fourth contact holes 11c and 11d.

The pixel electrode 22a, the connection wiring 22b, and the upper gate pad electrode 40b are formed by the following process. First, a transparent metal film and a fourth photo resist film are sequentially formed on the lower substrate 10 with the first to fourth contact holes 11a~11d. A fourth photo resist pattern (not shown) is provided on the transparent metal film by photo-transcribing a fourth mask onto the fourth photo resist film. Subsequently, the transparent metal film is partially etched using the fourth photo resist pattern as an etch mask, thereby forming the pixel electrode 22a, the connection wiring 22b, and the upper gate pad electrode 40b.

Such a fourth contact hole 11d further exposes the gate pattern 16b, which is under the data pattern 18c and forms its bottom surface, as well as the data pattern 18c between its side walls. In other words, the connection wiring 22b passes through the fourth contact hole 11d which exposes the data pattern 18c and the gate pattern 16b thereunder. As such, the connection wiring 22b has an area larger than that of the related art connection wiring via a contact hole which penetrates through only a single insulation film and exposes only the data pattern. Accordingly, the resistance of the connection wiring (i.e., the jumper portion) is reduced, and furthermore the contact resistance characteristic of the data linker 60 is enhanced.

Figure 3A:
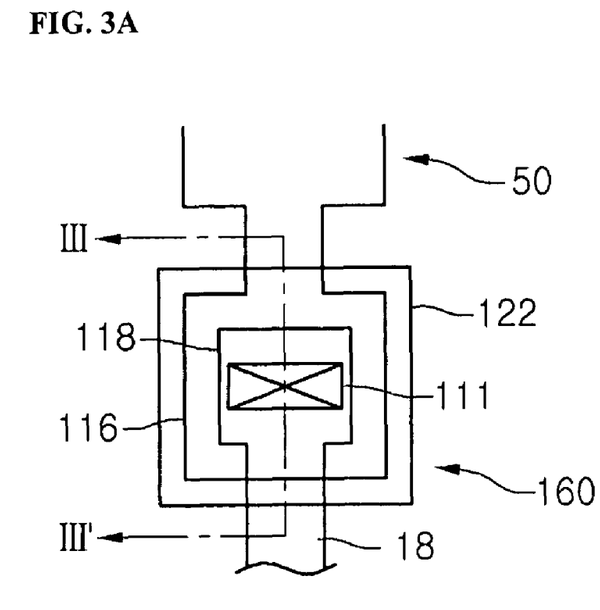
FIG. 3A is a planar view showing a thin film transistor array substrate according to a second embodiment the present disclosure.
Figure 3B:
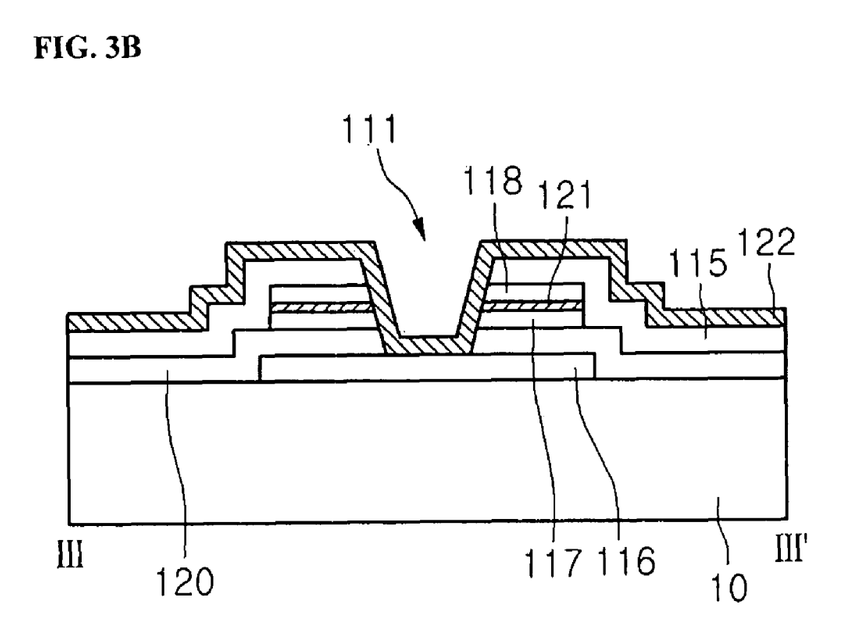
FIG. 3B is a cross-sectional view showing a data linker taken along the line of FIG. 3A.

FIG. 3A is a planar view showing a thin film transistor array substrate according to a second embodiment the present disclosure, and FIG. 3B is a cross-sectional view showing a data linker taken along the line of FIG. 3A. FIGS. 4A to 4D are cross-sectional views showing a process of manufacturing a data linker according to a second embodiment of the present disclosure.

A thin film transistor array substrate according to a second embodiment of the present disclosure has the same configuration as the one according to the first embodiment, with the exception of a data linker. In view of this point, only the data linker among the components of a thin film transistor array substrate according to a second embodiment of the present disclosure is shown in FIGS. 3A and 3B. In other words, the detailed explanation of the thin film transistor, gate pad, data line, data pad, and others, which are included in a thin film transistor array substrate according to a second embodiment of the present disclosure, will be omitted.

Referring to FIGS. 3A and 3B, a data linker (or a data linker) 160 according to a second embodiment of the present disclosure connects a data pad 50 with a data line 18, which is formed of a data pattern, by means of a jumper portion (i.e., a connection wiring 122). The data linker 160 is configured to include a gate pattern connected to a data pad 50, a data pattern 118 connected to the data line 18, and a connection wiring 122 connecting the gate pattern 116 with the data pattern 118. The data pattern 118 is formed to fully overlap with the gate pattern 116 in the center of a gate insulation film 120. The connection wiring (i.e., the jumper portion) 122 passes through a contact hole 111 and is connected to the data pattern 118 and the gate pattern 116. The contact hole 111 is formed to penetrate through a passivation film 115, the data pattern 118, an ohmic contact layer 121, an active layer 117, and a gate insulation film 120. More specifically, the data pattern 118 is exposed between the side walls (i.e., an upper side wall of the passivation film 115 and a lower side wall consisting of the ohmic contact layer 121, the active layer 117, and the gate insulation film 120) of the contact hole 111. The bottom surface of the contact hole 111d becomes the exposed portion of the gate pattern 116.

Such a connection wiring 122 passes through the contact hole 111 which exposes the data pattern 118 and the gate pattern 116 thereunder. As such, the connection wiring 122 has an area larger than that of the related art connection wiring via a contact hole which penetrates through only a single insulation film and exposes only the data pattern. Accordingly, the resistance of the connection wiring (the jumper portion) 122 is reduced, and furthermore the contact resistance characteristic of the data linker 160 is enhanced.

A method of manufacturing the data linker with such a configuration will now be explained in detail.

4A to 4D are cross-sectional views showing a process of manufacturing a data linker according to a second embodiment of the present disclosure. The method of manufacturing a thin film transistor array substrate according to a second embodiment of the present disclosure has the same configuration as the manufacturing method of the thin film transistor array substrate according the first embodiment, with the exception of a data linker. In view of this point, only a method of manufacturing the data linker among the components of a thin film transistor array substrate according to a second embodiment of the present disclosure is illustrated in FIGS. 4A to 4D. In other words, the detailed explanation about the manufacturing process of thin film transistor, gate pad, data line, data pad, and others, which are included in a thin film transistor array substrate according to a second embodiment of the present disclosure, will be omitted.

Figure 4A:
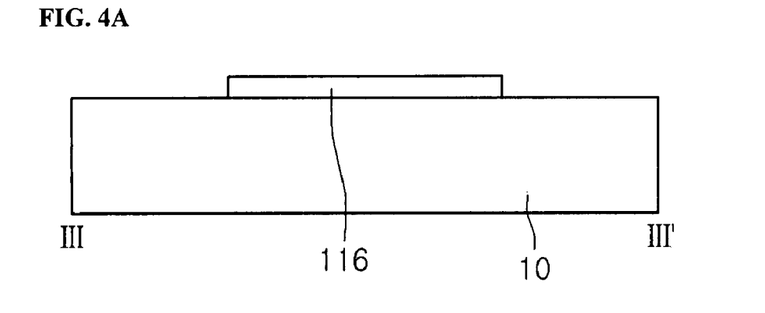
FIGS. 4A to 4D are cross-sectional views showing a process of manufacturing a data linker according to a second embodiment of the present disclosure.

As shown in FIG. 4A, a gate electrode 116 is formed on a lower substrate 10. The gate pattern 116 is positioned at a region in which a data pad (50 in FIG. 3A) and a data linker (160 in FIG. 3A) are defined. The gate pattern 116 is prepared through a process of sequentially forming a first metal film and a first photo resist film on the lower substrate 10, photo-transcribing a first mask onto the first photo resist film using a first mask so as to form a first photo resist pattern (not shown), and etching the first metal film using the first photo resist pattern as an etch mask.

Also, a gate insulation film 120 is formed on the lower substrate 10 which is provided with the gate pattern 116.

Figure 4B:
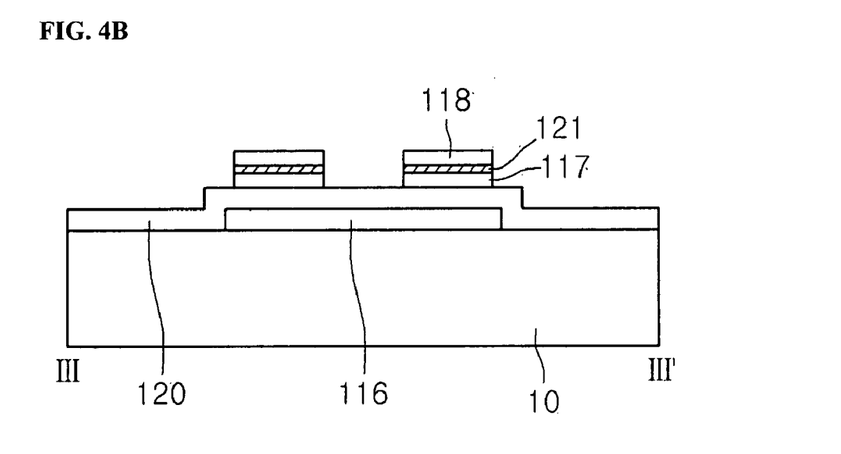

A data pattern 118 is formed on the lower substrate 10 covered with the gate insulation film 120, as shown in FIG. 4B. A stack layer of an active layer 117 and an ohmic contact layer 121 which are patterned in the data pattern 118 is formed under the data pattern 118. The ohmic contact layer 121 and the active layer 117 are formed of n+ amorphous silicon and intrinsic amorphous silicon, respectively. The active layer 117, the ohmic contact layer 121, and the data pattern 118 are prepared by sequentially forming an intrinsic amorphous silicon film, an n+ amorphous silicon layer, a second metal film, and a second photo resist film (not shown) on the entire surface of the lower substrate 10 covered with the gate insulation film 120, photo-transcribing a second mask onto the second photo resist film so as to form a second photo resist pattern (not shown), and sequentially etching the second metal film, the n+ amorphous silicon film, and the intrinsic amorphous silicon film using the second photo resist pattern as an etch mask.

Figure 4C:
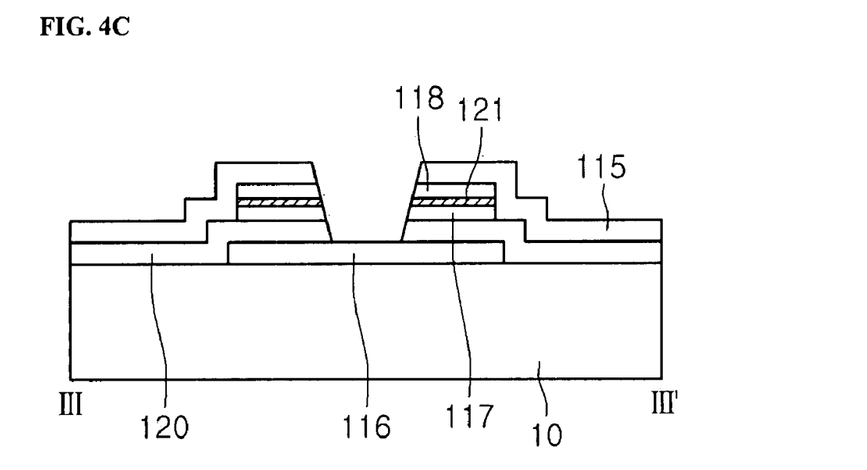

Thereafter, a passivation film 115 is formed on the lower substrate 10 partially covered with the data pattern 118, as shown in FIG. 4C. Also, a contact hole 111 is formed on the passivation film 115. The contact hole 111 penetrates the passivation film 115, the data pattern 118, the ohmic contact layer 121, the active layer 117, and the gate insulation film 120 and exposes a part of the gate pattern 116. The contact hole 111 further exposes the data pattern 118 between its side walls (i.e., an upper side wall of the passivation film 115 and a lower side wall consisting of the ohmic contact layer 121, the active layer 117, and the gate insulation film 120). Such a contact hole 111 uses the exposed portion of the gate pattern 116 as its bottom surface.

In order to form the first to the contact hole 111, a third photo resist film is provided on the passivation film 115. A third photo resist pattern is prepared on the passivation film 115 by photo-transcribing a third mask onto the third photo resist film. Subsequently, the passivation film 115, the data pattern 118, the ohmic contact layer 121, the active layer 117, and the gate insulation film 120 are partially etched using the third photo resist pattern as an etch mask, thereby forming the contact holes 111.

Figure 4D:
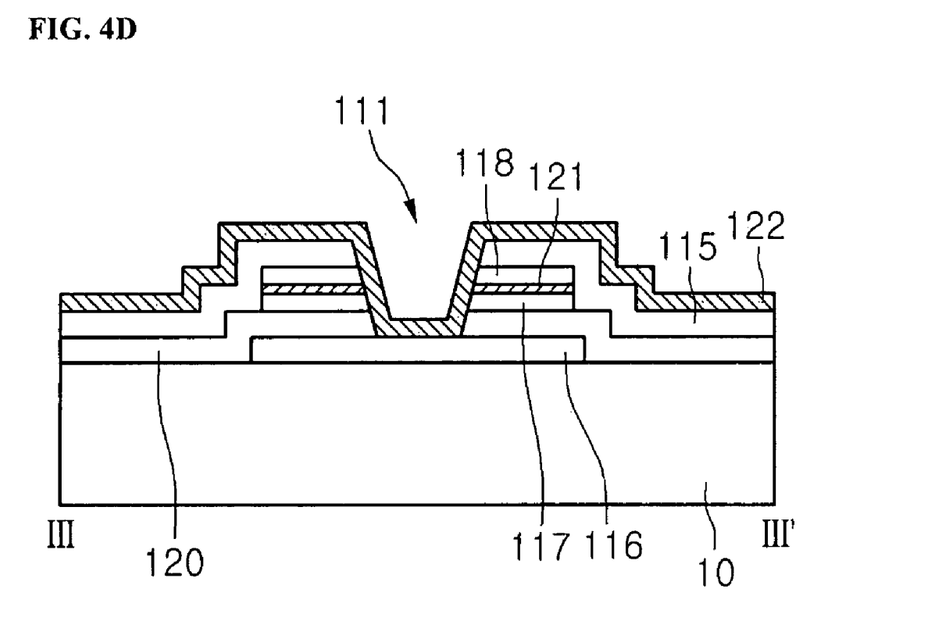

Next, a connection wiring (i.e., a jumper portion) 122 is formed on the lower substrate 10 with the contact holes 111 as shown in FIG. 4D. The connection wiring 122 is connected to the gate pattern 116 and the data pattern 118 through the contact holes 111. The connection wiring 122 is formed through the following process. First, a transparent metal film and a fourth photo resist film are sequentially formed on the lower substrate 10 with the contact holes 111. A fourth photo resist pattern (not shown) is provided on the transparent metal film by photo-transcribing a fourth mask onto the fourth photo resist film. Subsequently, the transparent metal film is partially etched using the fourth photo resist pattern as an etch mask, thereby forming the connection wiring 122.

In this way, a contact hole 111 further exposes the gate pattern 116, which is under the data pattern 118 and forms its bottom surface, as well as the data pattern 118 between its side walls. To rectify this, the connection wiring 122 passes through the contact hole 111 which exposes the data pattern 118 and the gate pattern 116 thereunder. The connection wiring 122 has an area larger than that of the related art connection wiring via a contact hole which penetrates through only a single insulation film and exposes only the data pattern. Accordingly, the resistance of the connection wiring (i.e., the jumper portion) 122 is reduced, and furthermore the contact resistance characteristic of the data linker 160 is enhanced.

Figure 5A:
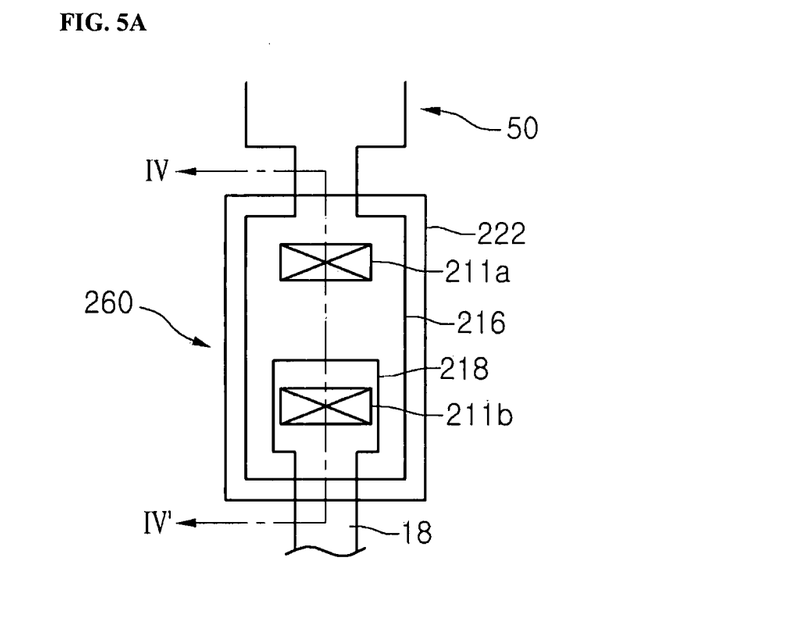
FIG. 5A is a planar view showing a thin film transistor array substrate according to a third embodiment the present disclosure.
Figure 5B:
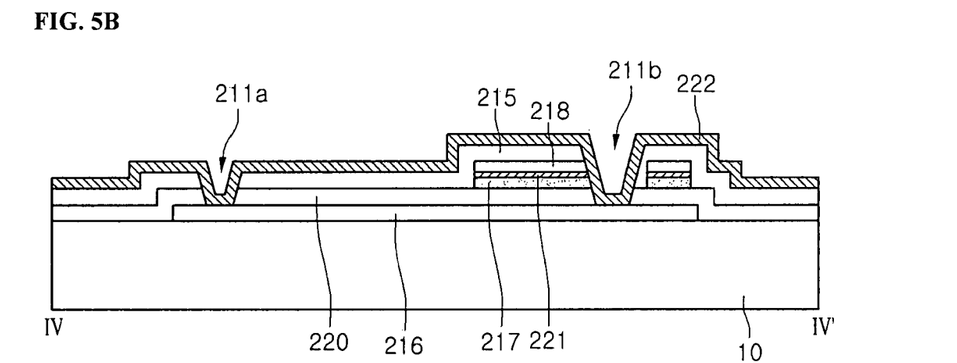
FIG. 5B is a cross-sectional view showing a data linker taken along the line IV-IV' of FIG. 5A.

FIG. 5A is a planar view showing a thin film transistor array substrate according to a third embodiment the present disclosure, and FIG. 5B is a cross-sectional view showing data linker taken along the line IV-IV' of FIG. 5A. FIGS. 6A to 6D are cross-sectional views showing a process of manufacturing a data linker according to a third embodiment of the present disclosure.

A thin film transistor array substrate according to a third embodiment of the present disclosure has the same configuration as the one according first embodiment, with the exception of a data linker (or wiring). In view of this point, only the data linker (or wiring) among the components of a thin film transistor array substrate according to a third embodiment of the present disclosure is shown in FIGS. 5A and 5B. In other words, the detailed explanation of the thin film transistor, gate pad, data line, data pad, and others which are included in a thin film transistor array substrate according to a third embodiment of the present disclosure will be omitted.

Referring to FIGS. 5A and 5B, a data linker 260 according to a third embodiment of the present disclosure connects a data pad 50 with a data line 18, which is formed of a data pattern, by means of a jumper portion (a connection wiring 222). The data linker 260 is configured to include a gate pattern 216 connected the data pad 50, a data pattern 218 formed to overlap with a part of the gate pattern 216 in the center of a gate insulation film 220, and a connection wiring 222 connected to the gate pattern 216 and the data pattern 218 each through first and second contact holes 211a and 211b. The first contact hole 211a penetrates through a passivation film 215 and the gate insulation film 220 and exposes a part of the gate pattern 216. The second contact hole 211b penetrates through the passivation film 215, the data pattern 218, an ohmic contact layer 221, an active layer 217, and the gate insulation film 220, so as to expose the data pattern 18c and the gate pattern 16b. More specifically, the data pattern 218 is exposed between parts of the side walls (i.e., a part of the left-lower wall and a left-upper side wall) of the second contact hole 211b. The surface of the gate pattern 216 under the data pattern 218 is used as the bottom surface of the second contact hole 211b.

In accordance therewith, the connection wiring 222 passes through the two contact holes 211a and 211b which expose the data pattern 218 and the gate pattern 216 thereunder. As such, the connection wiring 222 has an area larger than that of the related art connection wiring via a contact hole which penetrates through only a single insulation film and exposes only the data pattern. Therefore, the resistance of the connection wiring (i.e., the jumper portion) 222 is reduced, and furthermore the contact resistance characteristic of the data linker 260 is enhanced.

A method of manufacturing the data linker with such a configuration will now be explained in detail.

6A to 6D are cross-sectional views showing a process of manufacturing a data linker according to a third embodiment of the present disclosure. The method of manufacturing a thin film transistor array substrate according to a third embodiment of the present disclosure has the same configuration as the manufacturing method of the thin film transistor array substrate according the first embodiment, with the exception of a data linker. In view of this point, only a method of manufacturing the data linker among the components of a thin film transistor array substrate according to a third embodiment of the present disclosure is illustrated in FIGS. 6A to 6D. In other words, the detailed explanation about the manufacturing process of thin film transistor, gate pad, data line, data pad, and others, which are included in a thin film transistor array substrate according to a third embodiment of the present disclosure, will be omitted.

Figure 6A:
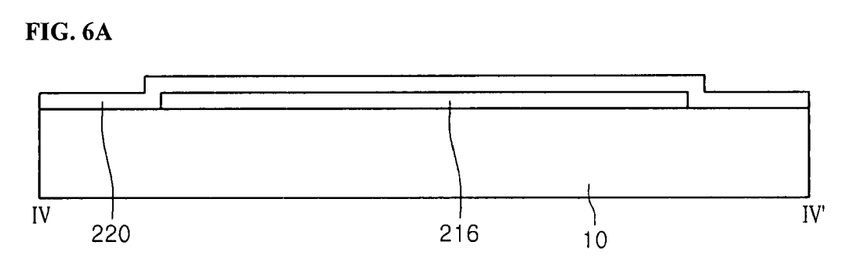
FIGS. 6A to 6D are cross-sectional views showing a process of manufacturing a data linker according to a third embodiment of the present disclosure.
Figure 6B:
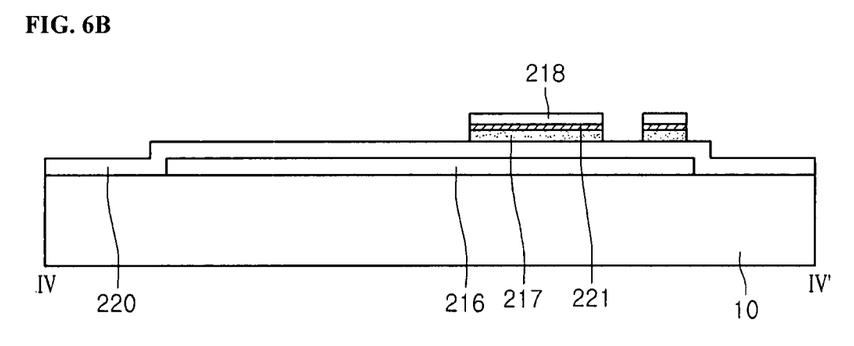
Figure 6C:
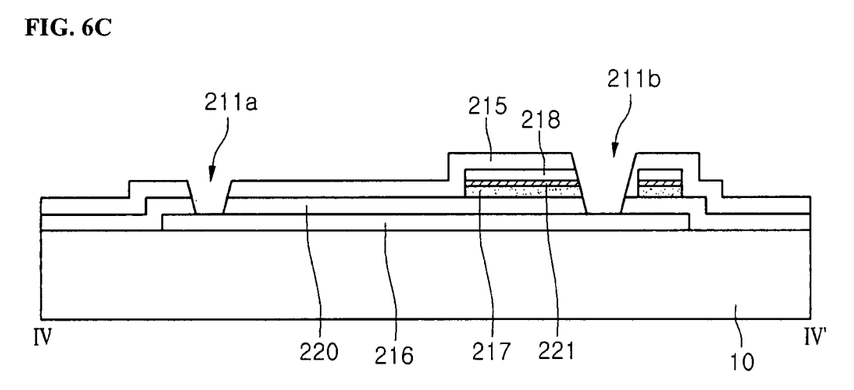

As shown in FIG. 6A, a gate electrode 216 is formed on a lower substrate 10. The gate pattern 216 is positioned at a region in which a data pad (50 in FIG. 5A) and a data linker (60 in FIG. 6A) are defined. The gate pattern 216 is prepared through a process of sequentially forming a first metal film and a first photo resist film on the lower substrate 10, photo-transcribing a first mask onto the first photo resist film using a first mask so as to form a first photo resist pattern (not shown), and etching the first metal film using the first photo resist pattern as an etch mask.

Also, a gate insulation film 220 is formed on the lower substrate 10 which is provided with the gate pattern 216.

A data pattern 218 is formed on the lower substrate 10 covered with the gate insulation film 220, as shown in FIG. 4B. A stack layer of an active layer 217 and an ohmic contact layer 221 which are patterned in the same shape as the data pattern 218 is formed under the data pattern 218. The ohmic contact layer 221 and the active layer 217 are formed of n+ amorphous silicon and intrinsic amorphous silicon, respectively. The active layer 217, the ohmic contact layer 221, and the data pattern 218 are prepared by sequentially forming an intrinsic amorphous silicon film, an n+ amorphous silicon layer, a second metal film, and a second photo resist film (not shown) on the entire surface of the lower substrate 10 covered with the gate insulation film 120, photo-transcribing a second mask onto the second photo resist film so as to form a second photo resist pattern (not shown), and sequentially etching the second metal film, the n+ amorphous silicon film, and the intrinsic amorphous silicon film using the second photo resist pattern as an etch mask.

Afterward, a passivation film 215 is formed on the lower substrate 10 partially covered with the data pattern 218, as shown in FIG. 4C. Also, first and second contact holes 211a and 211b are formed on the passivation film 215. The first contact hole 211a penetrates the passivation film 215 and the gate insulation film 220 and exposes a part of the gate pattern 216. The second contact hole 211b penetrates the passivation film 215, the data pattern 218, the ohmic contact layer 221, the active layer 217, and the gate insulation film 220 and exposes another part of the gate pattern 216. The second contact hole 211a further exposes the data pattern 218 between parts of its side walls (i.e., a left-upper side wall of the passivation film 215 and a left-lower side wall consisting of the ohmic contact layer 221, the active layer 217, and the gate insulation film 220). Such a second contact hole 211b uses the exposed portion of the gate pattern 216 as its bottom surface.

In order to form the first and second contact holes 211a and 211b, a third photo resist film is provided on the passivation film 215. A third photo resist pattern is prepared on the passivation film 215 by photo-transcribing a third mask onto the third photo resist film. Subsequently, either the passivation film 215 and the gate insulation film 220, or the passivation film 215, the data pattern 218, the ohmic contact layer 221, the active layer 217, and the gate insulation film 220 are partially etched using the third photo resist pattern as an etch mask, thereby forming the first and second contact holes 211a and 211b.

Next, a connection wiring (i.e., a jumper portion) 222 is formed on the lower substrate 10 with the first and second contact holes 211a and 211b as shown in FIG. 4D. The connection wiring 222 is connected to the gate pattern 216 and the data pattern 218 each through the first and second contact holes 211a and 211b. The connection wiring 222 is formed through the following process. First, a transparent metal film and a fourth photo resist film are sequentially formed on the lower substrate 10 with the first and second contact holes 211a and 211b. A fourth photo resist pattern (not shown) is provided on the transparent metal film by photo-transcribing a fourth mask onto the fourth photo resist film. Subsequently, the transparent metal film is partially etched using the fourth photo resist pattern as an etch mask, thereby forming the connection wiring 222.

Figure 6D:
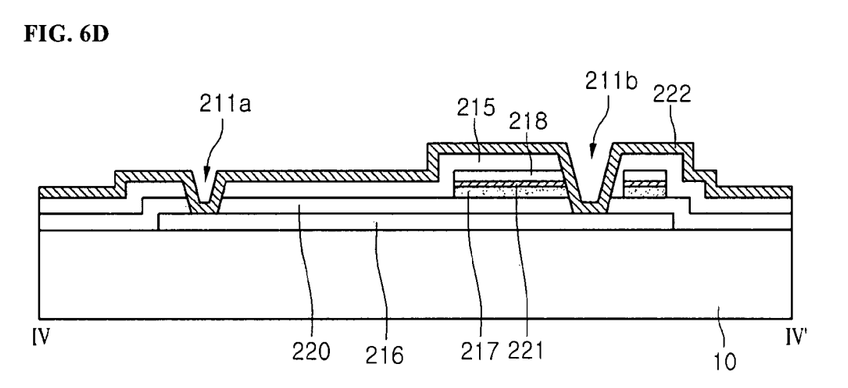

As described above, such a second contact hole 211b further exposes the gate pattern 216, which is under the data pattern 218 and forms its bottom surface, as well as the data pattern 218 between parts of its side walls. To rectify this, the connection wiring 222 passing through the second contact hole 211b which exposes the data pattern 218 and the gate pattern 216 thereunder. As such, the connection wiring 222 has an area larger than that of the related art connection wiring via a contact hole which penetrates through only a single insulation film and exposes only the data pattern. Accordingly, the resistance of the connection wiring (i.e., the jumper portion) 222 is reduced, and furthermore the contact resistance characteristic of the data linker 260 is enhanced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A thin film transistor array substrate comprising:
    gate lines and data lines formed to cross each other in the center of a gate insulation film on a substrate and to define pixel regions;
    a thin film transistor formed at each intersection of the gate and data lines;
    a passivation film formed on the thin film transistors;
    a pixel electrode formed on each of the pixel regions and connected to the thin film transistor through the passivation film;
    a gate pad connected to each of the gate lines through a gate linker; and
    a data pad connected to each of the data lines through a data linker,
    wherein the data pad is formed of a gate pattern, the data line is formed of a data pattern, the data linker is configured to connect the data pad formed of the gate pattern with the data line formed of the data pattern using a connection wiring and include the gate pattern connected to the data pad, the data pattern formed opposite to the gate pattern in the center of the gate insulation film, and the connection wiring configured to connect the gate pattern with the data pattern through a first contact hole which exposes the data pattern and the gate pattern by penetrating through the passivation film and the gate insulation film,
    wherein the whole of the data pattern is overlapped with a part of the gate pattern,
    wherein the first contact hole is formed in a center area of the gate pattern.

2. The thin film transistor array substrate claimed as claim 1, wherein the first contact hole is formed to expose the data pattern between its side walls and have a bottom surface corresponding to the exposed gate pattern.

3. The thin film transistor array substrate claimed as claim 1, wherein the first contact hole is formed to expose the data pattern between parts of its side walls and have a bottom surface corresponding to the exposed gate pattern.

4. The thin film transistor array substrate claimed as claim 1, further comprising a second contact hole formed to penetrate through the passivation film and the gate insulation film and expose the gate pattern.

5. The thin film transistor array substrate claimed as claim 4, wherein the connection wiring is configured to individually pass through the first and second contact holes.

* * * * *